United States Patent [19]
Dickson et al.

[11] Patent Number: 6,056,186
[45] Date of Patent: May 2, 2000

[54] METHOD FOR BONDING A CERAMIC TO A METAL WITH A COPPER-CONTAINING SHIM

[75] Inventors: Joseph F. Dickson, Cazenovia, N.Y.;
Lee Benat Max, San Jose, Calif.;
Jeffrey A. Karker, Cazenovia, N.Y.

[73] Assignee: Brush Wellman Inc., Cleveland, Ohio

[21] Appl. No.: 08/881,599

[22] Filed: Jul. 9, 1997

Related U.S. Application Data

[63] Continuation-in-part of application No. 08/670,810, Jun. 25, 1996, Pat. No. 5,760,473.

[51] Int. Cl.[7] .................................................. B23K 31/02
[52] U.S. Cl. ................................... 228/122.1; 228/124.1; 228/124.5; 228/195
[58] Field of Search ...................................... 228/189, 195, 228/122.1, 124.1, 175, 124.5; 438/123, 124, 687

[56] References Cited

U.S. PATENT DOCUMENTS

| | | |
|---|---|---|
| 3,994,430 | 11/1976 | Cusano et al. ........................... 228/122 |
| 3,996,603 | 12/1976 | Smith . |
| 4,172,261 | 10/1979 | Tsuzuki et al. . |
| 4,242,598 | 12/1980 | Johnson et al. . |
| 4,408,218 | 10/1983 | Grabbe . |
| 4,505,418 | 3/1985 | Neidig et al. ........................... 288/122 |
| 4,598,025 | 7/1986 | Mizuhara ................................. 428/450 |
| 4,603,474 | 8/1986 | Gobrecht et al. ........................ 29/597 |
| 4,639,760 | 1/1987 | Granberg et al. . |
| 4,646,129 | 2/1987 | Yerman et al. . |
| 4,649,416 | 3/1987 | Borkewski et al. . |
| 4,809,135 | 2/1989 | Yerman . |
| 4,871,108 | 10/1989 | Boecker et al. ......................... 228/122 |
| 4,902,854 | 2/1990 | Kaufman . |
| 5,075,759 | 12/1991 | Moline . |
| 5,241,216 | 8/1993 | Webster ................................. 257/762 |
| 5,371,405 | 12/1994 | Kagawa . |
| 5,490,627 | 2/1996 | Krum et al. . |
| 5,525,753 | 6/1996 | Mennucci et al. . |
| 5,583,317 | 12/1996 | Mennucci et al. . |
| 5,653,379 | 8/1997 | Forester et al. ........................ 228/124.1 |
| 5,760,473 | 6/1998 | Dickson et al. ........................ 257/728 |

OTHER PUBLICATIONS

Tummala, R.R. and Rymaszewski, E.J., "Microelectronics Packaging Handbook," Van Nostrand, New York, 1989.
Motorola RF Device Data DL 110/D, Rev. 5, (1996) pp. 2–273, 2–276, and 4–29.
Brush Wellman Drawing No. RF024, Rev. D, Mar. 27, 1996.
Brush Wellman Drawing No. RF083, Rev. B, Jun. 6, 1996.
Ericsson RF Power Transistors Data Book, pp. 15, 17, 143, 149.
Ericsson Preliminary PTF 10004 LDMOS FET Transistor, Draft Rev. Sep. 23, 1996, pp. 1–4.
BiPolarics Inc., BiPolarics Microwave Transistors from Small Signal to High Power, BA Series Silicon MMIC Amplifiers, 1 page.
Kashiba et al., Ceramic Sustrates with Molybdenum–Copper Layered Foil Conductors for Power Hybrids, ISHM '94 Proceedings, pp. 427–431.

*Primary Examiner*—Patrick Ryan
*Assistant Examiner*—Kiley Stoner
*Attorney, Agent, or Firm*—Calfee, Halter & Griswold LLP

[57] ABSTRACT

A method is provided for the bonding of ceramics to metals for the production of semiconductor packages. The method includes forming a copper-copper oxide eutectic on a substantially planar copper shim. The shim and its copper-copper oxide eutectic are placed in contact with a ceramic layer and metal layer. The assembly, so formed, is then heated to a temperature at least equal to the melting point of the eutectic and no greater than the melting temperature of copper. Upon cooling of the eutectic, a bond forms bond the ceramic layer to the metal layer.

19 Claims, 3 Drawing Sheets

6,056,186

METHOD FOR BONDING A CERAMIC TO A METAL WITH A COPPER-CONTAINING SHIM

RELATED APPLICATIONS

This is a continuation-in-part of copending patent application Ser. No. 08/670,810 filed Jun. 25, 1996, now U.S. Pat. No. 5,760,473.

FIELD OF THE INVENTION

The invention relates generally to semiconductor devices and the packaging thereof and, more particularly, to a method for bonding a ceramic to a metal by employing a copper-containing shim or interleaf.

BACKGROUND OF THE INVENTION

Many RF/microwave applications require high power transistors, i.e., transistors having a power output of 5 watts or more. These high power transistors are typically housed in packages which include a mounting flange for mounting the package on a support, such as a metal heat sink, as well as an intermediate ceramic layer for bonding the transistor to the flange in an electrically insulating manner. Since power transistors of this type produce large amounts of heat, the flange, insulating ceramic and semiconductor must have an acceptable match of coefficients of thermal expansion to prevent de-lamination from thermal stresses encountered in normal operation.

Recently, new types of high power transistors have been developed for use in RF/microwave applications. In these transistors, the ground of the transistor is located in the lower major surface or "backside" of the transistor, opposite the upper major surface or "top" where the gate and drain are located. A transistor of this type is intended to be directly connected, electrically, to the base on which it is supported. However, at the present time, packaging assemblies ideally suited for housing such backside ground high power transistors have not been developed.

Accordingly, there is a need for a method of making a package ideally suited for housing high power, backside-ground transistors.

SUMMARY OF THE INVENTION

According to one aspect of the present invention, a method is provided for bonding a ceramic to a metal. The method includes a plurality of steps. A substantially planar copper shim is formed which includes a rectangular window. The copper shim is oxidized so as to form a copper-copper oxide eutectic layer on a significant portion of the shim surface by chemically reacting the copper with an oxidizing agent. A first portion of the copper-copper oxide eutectic layer is placed in physical communication with a metal layer. A second portion of the copper-copper oxide eutectic layer is placed in physical communication with a ceramic layer. The first and second portions of the copper-copper oxide layer are disposed on opposite sides of the copper shim surface. The elements, so assembled, are heated to a temperature above the eutectic temperature of the copper-copper oxide eutectic so as to melt the eutectic. The eutectic is allowed to cool thereby bonding the ceramic and metal layers.

It is, therefore, an advantage of the present invention to provide a method for bonding a ceramic to a metal that is relatively inexpensive and simple to implement.

It is a further advantage of this invention to provide a method for bonding ceramics to metals having high affinities for oxygen.

It is yet further an advantage of the present invention to provide a method for fabricating a semiconductor package which allows a ceramic to be bonded to a metal through the use of a shim or interleaf.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

DETAILED DESCRIPTION OF ILLUSTRATED EMBODIMENT

Figure 1:
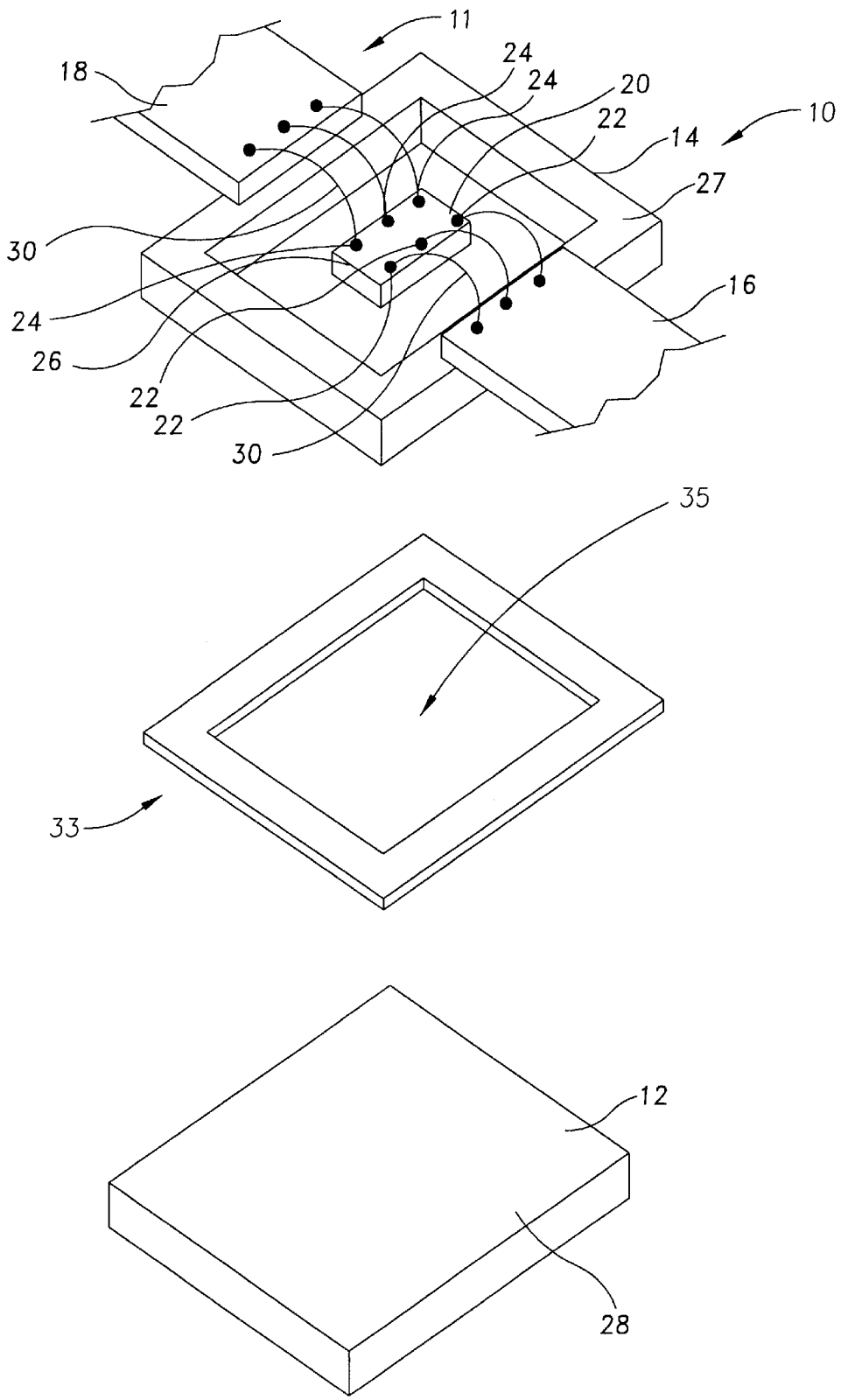
FIG. 1 is an exploded schematic view of an electronic assembly comprising a high power, backside-ground transistor received in the transistor package made by the method of the present invention.

Referring to FIG. 1, an electronic assembly in accordance with the present invention is generally indicated at 10. Electronic assembly 10 is composed of a high power transistor 20 and a transistor package, generally indicated at 11. Transistor package 11 is composed of a base 12, an insulator layer 14, an oxidized copper shim, or interleaf, 33 and package electrical leads 16 and 18 for electrical connection to the collector or gate and the drain of high power transistor 20. In the embodiment illustrated, base 12 is formed from a copper/tungsten composite, insulator layer 14 is formed from alumina, and package electrical leads 16 and 18 are formed from copper.

High power MOSFET transistor 20 is an RF/microwave power die or chip having a power rating of approximately 2 watts or more. It has three gate contacts 22 and three drain contacts 24 defined in its upper major surface 26. On its opposite or lower major surface, power transistor 24 defines a ground electrical contact which is in direct electrical contact with substantially flat upper major surface 28 of base 12 of transistor package 11. It should be noted that other types of transistors including, for example, bipolar transistors (BJT's) and Junction Field-Effect transistors (JFET's) may also be employed.

In the embodiment shown, insulator layer 14 is substantially flat and defines a lower major surface which is bonded to the upper or first major surface 28 of the base 12. Bonding of insulator layer 14 to base 12 is accomplished by direct copper bonding of the desirably oxidized shim 33. The shim 33 is preferably made from metallic copper which is then chemically oxidized so as to form a copper-copper oxide eutectic layer at least the shim surfaces that will be used for bonding. In an alternative embodiment, the shim 33 includes tough pitch copper, that is, oxygen-containing copper which includes a sufficient oxygen content so as to permit it to be bonded directly to a ceramic without the addition of further oxygen. Other materials which are suitable for shim 33 include tungsten copper, copper, E-material (25 to 74% BeO, balance beryllium metal), molybdenum, tungsten, copper graphite, copper clad Invar™) (Invar™ is 50% nickel, 50% iron), Cuvar™ (43% copper, 57% Invar™), Kovar, Alloy 42, silicon carbide, copper clad molybdenum, copper clad tungsten, copper molybdenum composites, copper tungsten composites, molybdenum, and E-Material™.

The oxidized copper shim 33 may also be made by a variety of copper layer fabrication techniques. These techniques include copper electroplating, electroless plating, physical vapor deposition, chemical vapor deposition, powder coating and sintering, powder roll bonding, sheet roll bonding, plasma spraying, ion plating, or laser glazing. A general description of these processes will now be presented.

Generally, copper electroplating deposits a copper layer by dissolving an anode of copper in a solution upon which an electric voltage is imposed and current flows such that a layer of copper is desirably deposited on a substrate. Particles of copper oxide are suspended in the solution and become entrapped in the depositing layer; thus producing the eutectic forming layer or shim. Electroless plating is a variant of this process in which the copper is deposited from a solution without imposing an electric voltage on the solution. As mentioned above, copper oxide can be included in the solution or deposit.

In physical and chemical vapor deposition, as well as ion plating, copper is deposited on a substrate by transporting it through a vapor phase or vacuum from a target material. In the case of physical vapor deposition, the target material is heated to a very high temperature. In the case of chemical vapor deposition, a chemical reaction in the vapor phase causes copper to be formed as a product of the reaction. In ion plating, the copper is transported through the vapor phase by an electric voltage imposed across the vapor gap between a source material and the substrate. In all three of these vapor deposition processes, copper oxide powder is deposited on the substrate. The copper powder can be spread on the substrate before being sintered and then rolled. Alternatively, copper powder or copper sheet can be rolled onto the surface of the substrate, the presence (or force) of which causes the copper powder/sheet to adhere to the surface. Copper oxide can be included in the powder mix or the sheet during the rolling operation.

In plasma spraying, copper powder can be fed through a jet of an electric arc and heated so as to cause it to adhere to the substrate. In laser glazing, the heat source is a laser beam through which the copper powder is fed. As described above, copper oxide powder can be included in the deposit.

In accordance with the method of the present invention, copper-containing and even copper-free metals can be securely bonded to various ceramics using the direct copper bonding process. More specifically, the copper shim, or interleaf, 33 has a preferred thickness in the range of about 0.001 to about 0.012 inches with a thickness of about 0.003 inches particularly preferred. However, thicknesses outside this range may also be employed if required. Shim 33 is preferably chemically oxidized so as to create a eutectic-forming copper-copper oxide layer on all of the shim 33 surfaces. However, as mentioned above, the shim may also comprise oxygen-containing copper. It should also be noted that in alternative embodiments, only the bonding surfaces may be oxidized or may include oxygen-containing copper, as opposed to the non-bonding surfaces.

Figure 2:
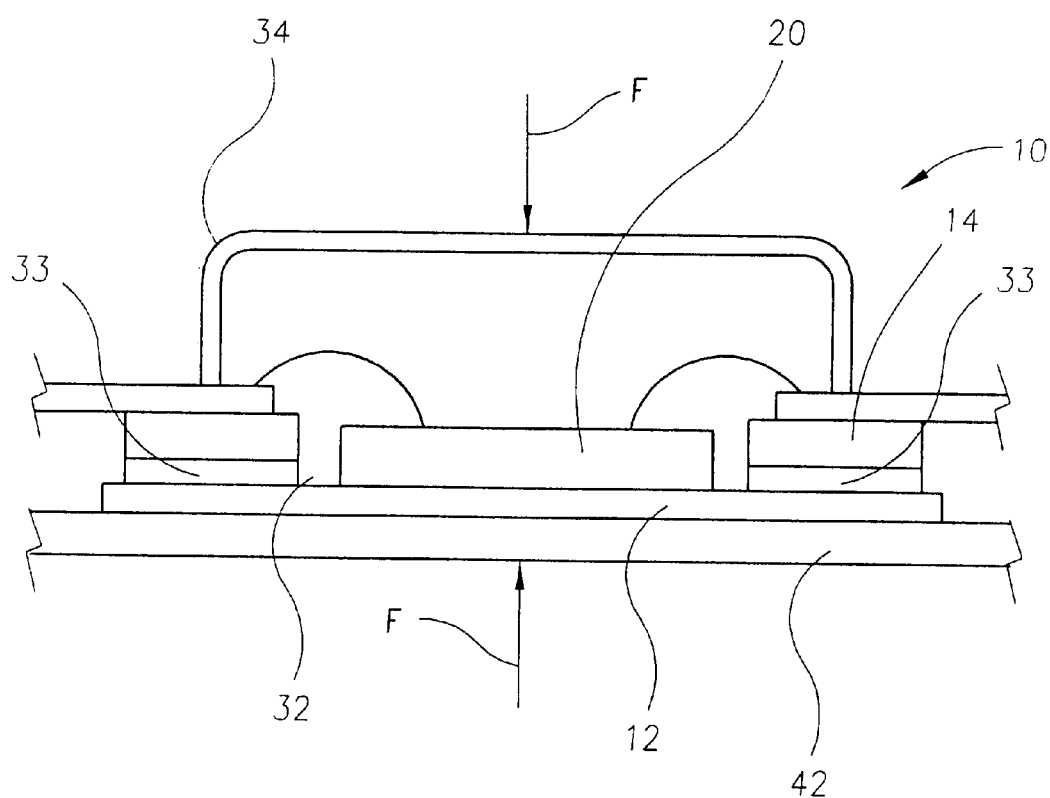
FIG. 2 is an elevational view of the transistor package of FIG. 1 when in an assembled condition and further provided with a cap.

Shim 33 is substantially planar in nature and includes a window 34 which is sized to the dimensions of cavity 32 (shown in FIG. 2). However, window 34 may be of any size or geometry, so long as it provides an adequate space for attaching power transistor 20 to metal base 12. While shim 33 is preferably square or rectangular, it may be of any desired geometry which is required by a design's specification. Additionally, shim 33 may extend beyond the limits of the ceramic and metal layers so as to provide the package of the present invention with additional or alternative electrical contacts, thermal contacts, or mechanical features such as fastening elements. Shim 33 may extend beyond the metal and ceramic limits so as to provide an eutectic melt that can bond to the sides of these layers, thereby strengthening the overall bond.

Further in accord with the method of the present invention, the oxidized shim 33 is placed in physical communication with metal base 12 and ceramic layer 14. A first portion of the copper-copper oxide eutectic layer is placed in physical communication with metal layer 12 and a second portion of the copper-copper oxide eutectic layer is placed in physical communication with ceramic or insulator layer 14. This placement is preferably accomplished by placing shim 33, metal layer 12 and ceramic layer 14 in a fixture. Shim 33, metal layer 12 and ceramic layer 14 are then heated in an inert atmosphere to a temperature equal to or greater than the eutectic temperature of the copper-copper oxide eutectic but no more than the melting point of copper for a sufficient period of time. The eutectic temperature of the copper-copper oxide eutectic is about 1065° C. and the melting point of copper of is about 1083° C. The preferred heating temperature is approximately 1072° C. During this heating, an eutectic melt is formed at the interfaces between shim 33 and metal layer 12 and shim 33 and ceramic layer 14. Shim 33, metal layer 12, and ceramic layer 14 are preferably heated for a sufficient period of time, generally a few seconds, at this temperature to form a melt at the interfaces which, upon cooling forms a bond. Further information relating to the direct copper bonding process can be found in U.S. Pat. No. 3,994,430 to Cusano et al., which is hereby fully incorporated by reference. Accordingly, the method of the present invention may be employed to bond ceramic insulator layer 14 to metal base 12 even though these components may not be formed from copper or a copper-containing material.

Referring again to FIG. 1, package electrical leads 16 and 18 take the form of substantially flat layers of copper metal, which are bonded to the upper major surface 27 of insulator layer 14. This bonding can be accomplished via conventional direct copper bonding processes wherein the bonding surfaces are oxidized and directly bonded to the insulator layer. Alternatively, the package electrical leads 16 and 18 can take the form of substantially flat layers of CuMoCu or CuInvarCu which are bonded to the upper major surface 27 of insulator layer 14. The advantage of these materials over copper metal is that they provide more closely matched coefficients of thermal expansion with the ceramic insulator and higher temperature cycle survivability than copper. Furthermore, the following materials may also be suitable for use as package electrical leads: tungsten copper, copper, E-material (25 to 74% BeO, balance beryllium metal), molybdenum, tungsten, copper graphite, copper clad Invar™ (Invar™ is 50% nickel, 50% iron), Cuvar™ (43% copper, 57% Invar™), Kovar, Alloy 42, silicon carbide, copper clad molybdenum, copper clad tungsten, copper molybdenum composites, cooper tungsten composites, molybdenum, and E-Material™.

In order to electrically connect the collector contacts 22 and the drain contacts 24 on power transistor 20 to package electrical leads 16 and 18, six transistor leads 30, which in the embodiment shown comprise gold or aluminum wires, are provided. As shown in FIG. 1, three of these transistor leads 30 connect gate contacts 22 with the leading end of package electrical lead 16 located adjacent power transistor 20, while the other three transistor leads 30 connect drain contacts 24 with package electrical lead 18 at its leading end adjacent power transistor 20. This wire bonding of the chip to the package leads is the conventional method of chip to package interconnection.

FIG. 2 illustrates the electronic assembly of FIG. 1 in an assembled condition. As can be seen from this figure, base 12 together with insulator layer 14 define a cavity 32 therein which receives power transistor 20. If desired, a cap 35 can be provided. Cap 35, together with base 12 and insulator layer 14, completely enclose power transistor 20 therein.

Figure 3:
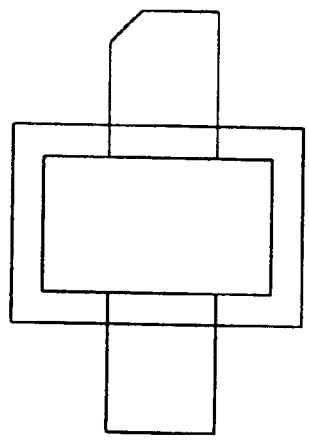
FIG. 3 is a plan view of another electronic assembly made in accordance with the principles of the present invention.
Figure 4:
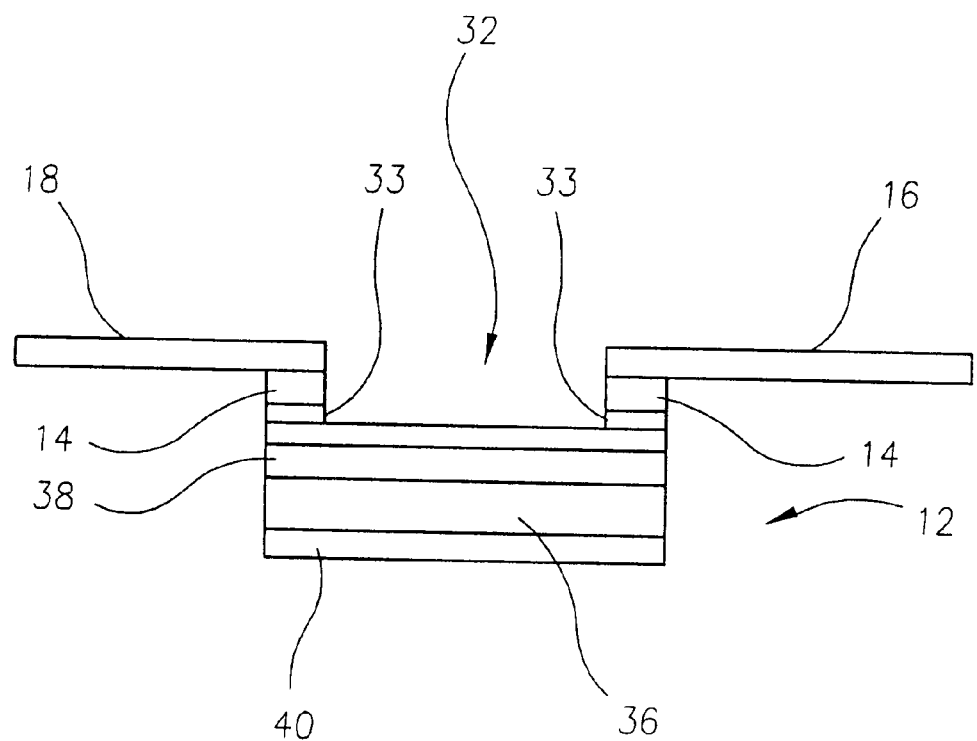
FIG. 4 is an elevational view of the transistor package of FIG. 3 when mounted on a substrate such as a heat sink.

FIGS. 3 and 4 illustrate another transistor package produced in accordance with the present invention. The transistor package of FIGS. 3 and 4 is similar to the transistor package of FIGS. 1 and 2 except that base 12 of this package comprises a layer of molybdenum 36 clad on both sides with copper layers 38 and 40. In addition, the leading ends of package electrical leads 16 and 18, i.e., the edges facing cavity 32 are coterminous with the inside faces of insulator layer 14 defining cavity 32 rather than being spaced slightly away from these faces as in the case of the package of FIGS. 1 and 2.

The transistor package of the present invention can be made from a wide variety of different materials and combinations of materials. For example, in addition to alumina, insulator layer 14 can be made from other electrically-insulating, heat-resistant materials such as beryllia, aluminum nitride, mullite, sapphire, diamond, and zirconia-containing alumina. Alumina, however, is preferred.

Similarly, package electrical leads 16 and 18 can be made from a wide variety of different materials in addition to copper, such as beryllium, tungsten copper, silver copper, Kovar (54% iron, 29% nickel, 16% cobalt), nickel and Alloy 42 (42% nickel, 58% iron). Copper is preferred.

In the same way, base 12 can be made from a wide variety of materials other than the copper/tungsten composite and copper clad molybdenum materials illustrated in FIGS. 1 to 4. Examples are tungsten copper, copper, E-material (25 to 74% BeO, balance beryllium metal), molybdenum, tungsten, copper graphite, copper clad Invar™ (Invar™ is 50% nickel, 50% iron), Cuvar™ (43% copper, 57% Invar™), Kovar, Alloy 42, and silicon carbide. Preferred materials are copper clad molybdenum, copper clad tungsten, copper molybdenum composites, cooper tungsten composites, molybdenum, and E-Material™.

It will, therefore, be appreciated that a wide variety of choices are available in designing transistor packages of the present invention for particular applications, paying due regard to anticipated conditions of heat load, temperature variations and environment.

The resultant package is rugged in construction and, therefore, can be used in a wide variety of different applications. In this connection, a particularly desirable feature of the inventive transistor package and electronic assembly made therefrom is that it can be easily connected to a substrate such as a heat sink by a simple compressive device. This is illustrated in FIG. 2 which shows the electronic assembly 10 of the present invention being mounted on a heat sink 42 of a piece of electronic equipment by means of a clamp (not shown) exerting a compressive force acting in the directions of arrows F in FIG. 2. Mounting of the electronic package in this manner eliminates the screws or other fastening means used in prior art technology and hence is very attractive from a cost reduction standpoint.

While the present invention has been illustrated by the description of embodiments thereof, and while the embodiments have been described in considerable detail, it is not the intention of the specification to restrict or in any way limit the scope of the appended claims to such detail. Additional advantages and modifications will readily appear to those skilled in the art. For example, the geometry of the ceramic and metal layers may be varied, along with the geometry of the shim. Therefore, the invention, in its broader aspects, is not limited to the specific details, the representative apparatus, and illustrative examples shown and described. Accordingly, departures may be made from such details without departing from the spirit or scope of the applicant's general inventive concept.

We claim:

1. A method for bonding a ceramic to a metal comprising the steps of:
   (a) contacting a material having a first copper-copper oxide eutectic portion and a second copper-copper oxide eutectic portion with said ceramic and said metal, wherein said first copper-copper oxide eutectic portion is disposed opposite said second copper-copper oxide eutectic portion;
   (b) heating said first and second copper-copper oxide eutectic portions to a temperature which is at least equal to the melting temperature of the first and second copper-copper oxide eutectic portions but no more than the melting temperature of copper; and
   (c) allowing said first and second copper-copper oxide eutectic portions to solidify, thereby bonding said ceramic to said metal.

2. The method of claim 1 wherein the step of heating said first and second copper-copper oxide eutectic portions to a temperature which at least equal to their melting temperature but no more than the melting temperature of copper comprises the step of heating said first and second copper-copper oxide eutectic portions to a temperature which is in the range of about 1065° C. to about 1083° C.

3. The method of claim 1 wherein the material is a shim.

4. The method of claim 1 wherein the step of contacting a material comprising a first copper-copper oxide eutectic portion and a second copper-copper oxide eutectic portion with said ceramic and said metal comprises the step of contacting a shim having a first surface comprising said first copper-copper oxide eutectic portion and a second surface comprising said second copper-copper oxide eutectic portion.

5. The method of claim 1 wherein the metal comprises substantially copper-free metal.

6. The method of claim 1 wherein the metal comprises a copper-containing metal.

7. A method for bonding a ceramic to a metal comprising the steps of:
   (a) forming a substantially planar copper shim having a window therein, wherein this step includes the step of forming a window in the planar copper shim;
   (b) oxidizing all bonding surfaces of the planar copper shim to form a copper-copper oxide eutectic thereon;
   (c) placing a first copper-copper oxide eutectic layer of the oxidized planar copper shim in physical communication with a metal layer;
   (d) placing a second copper-copper oxide eutectic layer of the oxidized copper shim in physical communication with a ceramic layer;
   (e) heating the planar copper shim, ceramic layer, and metal layer to a temperature above the eutectic temperature of the copper-copper oxide eutectic; and (f) allowing the eutectic to cool thereby bonding the ceramic and metal layers.

8. The method of claim 7 wherein the step of oxidizing all contact surfaces of the planar copper shim to form a copper-copper oxide eutectic thereon comprises the step of chemically reacting a substantial portion of the bonding surfaces of the copper shim with an oxidizing agent.

9. The method of claim 7 further comprising the step of oxidizing all surfaces of the copper shim.

10. The method of claim 7 wherein the step of heating the planar copper shim, ceramic layer, and metal layer to a temperature above the eutectic temperature of the copper-copper oxide eutectic comprises the step of heating to a temperature in the range of about 1065° C. to about 1083° C.

11. The method of claim 7 wherein the step of forming a substantially planar copper shim further comprises the step of forming a substantially rectangular shim.

12. The method of claim 7 further comprising the step of attaching a first and second metallic lead to the ceramic layer.

13. A method for bonding a ceramic to a metal to thereby form a semiconductor package, the method comprising the steps of:

(a) forming a substantially planar copper shim having a window therein, wherein this step includes the step of forming a substantially rectangular window in the planar copper shim;

(b) oxidizing all bonding surfaces of the planar copper shim to form a copper-copper oxide eutectic thereon, wherein this step includes the step of chemically reacting the planar copper shim with an oxidizing agent;

(c) placing a first copper-copper oxide eutectic layer of the oxidized planar copper shim in physical communication with a metal layer;

(d) placing a second copper-copper oxide eutectic layer of the oxidized copper shim in physical communication with a ceramic layer, wherein the first and second copper-copper oxide layers are disposed on opposite sides of the planar copper shim, (e) heating the planar copper shim, ceramic layer, and metal layer to a temperature above the eutectic temperature of the copper-copper oxide eutectic;

(f) allowing the eutectic to cool thereby bonding the ceramic and metal layers; and (g) bonding a heat sink to the metal layer.

14. The method of claim 13 wherein the step of oxidizing all bonding surfaces of the planar copper shim to form a copper-copper oxide eutectic thereon comprises the step of chemically reacting a substantial portion of the bonding surfaces of the copper shim with an oxidizing agent.

15. The method of claim 13 further comprising the step of oxidizing all surfaces of the copper shim.

16. The method of claim 13 wherein the step of heating the planar copper shim, ceramic layer, and metal layer to a temperature above the eutectic temperature of the copper-copper oxide eutectic comprises the step of heating to a temperature in the range of about 1065° C. to about 1083° C.

17. The method of claim 13 further comprising the step of attaching a first and second metallic lead to the ceramic layer.

18. The method of claim 13 wherein the metal layer is selected from the group consisting of copper tungsten composite, copper clad molybdenum, copper, molybdenum, tungsten, copper graphite, copper clad Invar™, Cuvar™, Kovar, Alloy 42, and silicon carbide, copper clad molybdenum, copper clad tungsten, copper molybdenum composites, cooper tungsten composites, and E-Material™.

19. The method of claim 13 wherein the ceramic layer is selected from the group consisting of alumina, beryllia, aluminum nitride, mullite, sapphire, diamond, and zirconia-containing alumina.

* * * * *